United States Patent
Yamashita

(10) Patent No.: US 11,076,521 B2
(45) Date of Patent: Jul. 27, 2021

(54) PRODUCTION PLAN CREATION SYSTEM AND PRODUCTION PLAN CREATION METHOD

(71) Applicant: FUJI CORPORATION, Chiryu (JP)

(72) Inventor: Yukihiro Yamashita, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 118 days.

(21) Appl. No.: 16/315,187

(22) PCT Filed: Jul. 8, 2016

(86) PCT No.: PCT/JP2016/070345
§ 371 (c)(1),
(2) Date: Jan. 4, 2019

(87) PCT Pub. No.: WO2018/008157
PCT Pub. Date: Jan. 11, 2018

(65) Prior Publication Data
US 2019/0313559 A1 Oct. 10, 2019

(51) Int. Cl.
*H05K 13/08* (2006.01)
*G05B 19/418* (2006.01)

(52) U.S. Cl.
CPC ... *H05K 13/0857* (2018.08); *G05B 19/41865* (2013.01); *H05K 13/085* (2018.08); *H05K 13/0882* (2018.08)

(58) Field of Classification Search
CPC ............. H05K 13/0857; H05K 13/085; H05K 13/0882; G05B 19/41865
(Continued)

(56) References Cited

U.S. PATENT DOCUMENTS 10,522,427 B2 * 12/2019 Chan ................ G05B 19/41865
2007/0129978 A1 * 6/2007 Shirasu .................. G06Q 10/06
705/7.11
(Continued)

FOREIGN PATENT DOCUMENTS

JP 5-37199 A 2/1993

OTHER PUBLICATIONS

International Search Report dated Sep. 13, 2016 in PCT/JP2016/070345 filed on Jul. 8, 2016.

*Primary Examiner* — Jigneshkumar C Patel
(74) *Attorney, Agent, or Firm* — Oblon, McClelland, Maier & Neustadt, L.L.P.

(57) ABSTRACT

A production plan creation computer, in a production plan creation process before starting production, creates or enters multiple production jobs required for producing the multiple types of component-mounted boards that are planned to be produced, and predicts or enters a production job that may become a jump-the-queue job to be produced unscheduled while one of the multiple production jobs is being produced. Next, the jump-the-queue job and the production jobs are grouped into multiple setup groups, with the jump-the-queue job being included in all the setup groups. Here, the jobs are grouped in each setup group such that it is possible to switch between the production jobs and the jump-the-queue job without performing changeover. The priorities of the jump-the-queue job and the production jobs are determined, and the feeder arrangement is optimized for each setup group based on the priorities of the jump-the-queue job and the production jobs.

18 Claims, 7 Drawing Sheets

Example of component types used for production jobs divided into each setup group

| | Production jobs divided into each setup group | Used component types |
|---|---|---|
| Setup group 1 | Production job number 1<br>Production job number 2<br>Production job number 3 | A, B, C, D, E, F, G, H, I |
| Setup group 2 | Production job number 1<br>(jump-the-queue job)<br>Production job number 4<br>Production job number 5 | A, B, C, J, K, L, M, N, O |
| Setup group 3 | Production job number 1<br>(jump-the-queue job)<br>Production job number 6<br>Production job number 7 | A, B, C, P, Q, R, S, T, U |

(58) Field of Classification Search
USPC .......................................................... 700/100
See application file for complete search history.

(56) References Cited

U.S. PATENT DOCUMENTS

| | | | |
|---|---|---|---|
| 2008/0228295 A1* | 9/2008 | Okuda | G05B 19/0426 |
| | | | 700/86 |
| 2015/0296671 A1* | 10/2015 | Pfaffinger | H05K 13/08 |
| | | | 29/830 |
| 2016/0128247 A1* | 5/2016 | Koike | H05K 13/08 |
| | | | 29/739 |

* cited by examiner

FIG. 4

Example of component types used for jump-the-queue job and production jobs

|  | Used component types | Priority of each production job for feeder arrangement of fig. 6 | Priority of each production job for feeder arrangement of fig. 7 |
|---|---|---|---|
| Production job number 1 (jump-the-queue job) | A, B, C | High | Low |
| Production job number 2 | D, E, F | Medium | High |
| Production job number 3 | G, H, I | Low | Medium |
| Production job number 4 | J, K, L | Medium | High |
| Production job number 5 | M, N, O | Low | Medium |
| Production job number 6 | P, Q, R | Medium | High |
| Production job number 7 | S, T, U | Low | Medium |

FIG. 5

Example of component types used for production jobs divided into each setup group

| | Production jobs divided into each setup group | Used component types |
|---|---|---|
| Setup group 1 | Production job number 1<br>Production job number 2<br>Production job number 3 | A, B, C, D, E, F, G, H, I |
| Setup group 2 | Production job number 1 (jump-the-queue job)<br>Production job number 4<br>Production job number 5 | A, B, C, J, K, L, M, N, O |
| Setup group 3 | Production job number 1 (jump-the-queue job)<br>Production job number 6<br>Production job number 7 | A, B, C, P, Q, R, S, T, U |

PRODUCTION PLAN CREATION SYSTEM AND PRODUCTION PLAN CREATION METHOD

TECHNICAL FIELD

The present application relates to a production plan creation system and a production plan creation method for creating a production plan used to produce a component-mounted board by using a component mounting machine to mount components on a circuit board.

BACKGROUND ART

When producing multiple types of component-mounted boards using a component mounting machine, multiple production jobs (production programs) required for producing the multiple types of component-mounted boards are created and operation is repeated of completing one production job and switching to the next production job to perform the next production, so as to produce the multiple types of component-mounted boards. In general, there are many cases in which the combination of component types to be used differs for each type of component-mounted board to be produced, thus, if the feeder arrangement (combination) used in the previous job is left as is it may not be possible to supply the components to be used in the next production job. In such a case, when the production job is changed, it is necessary to perform changeover work of changing the arrangement of feeders loaded on the component mounting machine.

Because this changeover work is performed manually by an operator, if the quantity of changeover operations (quantity of feeder exchange operations) increases, productivity drops. Because the quantity of feeders that can be loaded on a component mounting machine is greater than the quantity of component types used in a single production job, to reduce the quantity of changeover operations, feeders are arranged such that all the components to be used in consecutive multiple production jobs can be supplied (refer to, for example, patent literature 1), and when production has been completed of a single setup group for which multiple production jobs can be performed using the same feeder arrangement, changeover is performed, then production is switched to production jobs of the next setup group.

CITATION LIST

Patent Literature

Patent literature 1: JP-A-H5-37199

BRIEF SUMMARY

Technical Problem

However, there are cases in which, during production of a production job of a setup group determined in advance, production needs to be performed of a new unscheduled production job (jump-the-queue job). In such a case, in many cases the feeder arrangement (combination) required for the jump-the-queue job differs from the feeder arrangement used for the current setup group. Here, when changing over to the jump-the-queue job, an operator must perform troublesome work of changing the feeder arrangement to that of the jump-the-queue job, then, when production of the jump-the-queue job is complete, returning the feeder arrangement to that of the original setup group, which causes a drop in productivity.

Thus, an object of the present disclosure is to improve productivity when a jump-the-queue job that needs to be performed unscheduled during production of a production job of a setup group determined in advance arises, by enabling production of the jump-the-queue job without performing changeover.

Solution to Problem

To solve the above problems, the present disclosure is a production plan creation system for creating a production plan for producing a component-mounted board by exchangeably loading multiple feeders on a component mounting machine, picking up components supplied by the feeders using suction nozzles of the component mounting machine, and mounting the components on a circuit board, the production plan creation system including: a production job grouping means configured to, when grouping multiple production jobs required to produce multiple types of component-mounted boards that are planned into multiple setup groups, group production jobs such that changeover is not required for each of the setup groups; and a jump-the-queue job prediction means configured to predict or enter a production job (hereinafter referred to as a "jump-the-queue job") that may need to be performed unscheduled during a period in which one of the multiple production jobs is being performed, wherein the production job grouping means performs grouping such that the jump-the-queue job predicted or entered by the jump-the-queue prediction means is included in all of the multiple setup groups or in at least two of the multiple setup groups.

According to this configuration, when creating a production plan, a jump-the-queue job is predicted or entered, and that jump-the-job is included in all of or at least two of the multiple setup groups, thus, even if the jump-the-queue job actually needs to be performed during a period while one of the production jobs of a setup group is being performed, so long as the setup group includes the jump-the-queue job, the jump-the-queue production job can be performed without performing changeover, thereby improving productivity.

In this case, the jump-the-queue job prediction means may predict or enter a production job that may become the jump-the-queue job from the multiple production jobs required to produce the multiple types of component-mounted boards that are planned. Alternatively, the jump-the-queue job may be predicted or entered from production jobs other than the multiple production jobs required to produce the multiple types of component-mounted boards that are planned (for example, for production jobs performed in the past, production jobs that may be performed in the future, or the like).

Further, prediction of a jump-the-queue job may be performed in any manner, for example, a jump-the-queue job may be predicted or entered by an operator based on experience, production results, order trends, or the like; alternatively, production result data related to previously performed production jobs and jump-the-queue jobs may be memorized on a memory means, and the jump-the-queue job prediction means may automatically predict the jump-the-queue job based on the production results data memorized on the memory means.

In this case, the quantity of predicted jump-the-queue jobs is not limited to one, the quantity may be two or greater, but if the quantity of jump-the-queue jobs is large, it will be difficult to include all the jump-the-queue jobs in the multiple setup groups.

Thus, the production job grouping means, in a case in which the quantity of the jump-the-queue jobs predicted or entered by the jump-the-queue job prediction means exceeds a possible grouping quantity of the setup groups, may select the jump-the-queue job to be grouped in the setup group based on at least one of a priority level of each of the jump-the-queue jobs or a jump-the-queue frequency of the jump-the-queue jobs. Thus, if the quantity of predicted or entered jump-the-queue jobs is large, the jump-the-queue jobs grouped in the setup groups can be limited to those with a high priority or those with a high jump-the-queue frequency. Note that, a portion of jump-the-queue jobs grouped in a setup group may be different to another portion of jump-the-queue jobs grouped in a setup group.

Also, among jump-the-queue jobs, there may be some jobs with a higher priority than normal production jobs and some jobs with a lower priority than normal production jobs. And, among jump-the-queue jobs, some jobs may have a lower jump-the-queue frequency and some jobs may have a higher jump-the-queue frequency. Further, depending on the feeder arrangement (loading order), the production efficiency of the jump-the-queue jobs or the production jobs may change, thereby changing the production time.

Considering these circumstances, the present disclosure may be configured to include a feeder arrangement optimization means configured to optimize an arrangement of the feeders to be loaded on the component mounting machine, the feeder arrangement optimization means being configured to optimize the feeder arrangement of each of the setup groups based on at least one of the priority level of each of the jump-the-queue jobs or the jump-the-queue frequency of the jump-the-queue jobs predicted or entered by the jump-the-queue job prediction means. For example, if the priority of the jump-the-queue job is low, optimization of the feeder arrangement may be performed giving priority to the normal production jobs, but if the priority of the jump-the-queue job is high, optimization of the feeder arrangement may be performed giving priority to jump-the-queue job; further, optimization of the feeder arrangement may be performed after determining the priority from the jump-the-queue frequency of the jump-the-queue job.

In this case, the determination of the priority of the jump-the-queue jobs and the jump-the-queue frequency of the jump-the-queue jobs may be performed automatically by the production plan creation system, or at least one of the priority of the jump-the-queue jobs and the jump-the-queue frequency of the jump-the-queue jobs may be set by an operator using a setting means.

BRIEF DESCRIPTION OF DRAWINGS

FIG. 4 illustrates an example of types of production jobs, a jump-the-queue job, and component types to be used.

FIG. 5 illustrates an example of production jobs and a jump-the-queue jobs grouped into setup groups and component types to be used.

DESCRIPTION OF EMBODIMENTS

Figure 1:
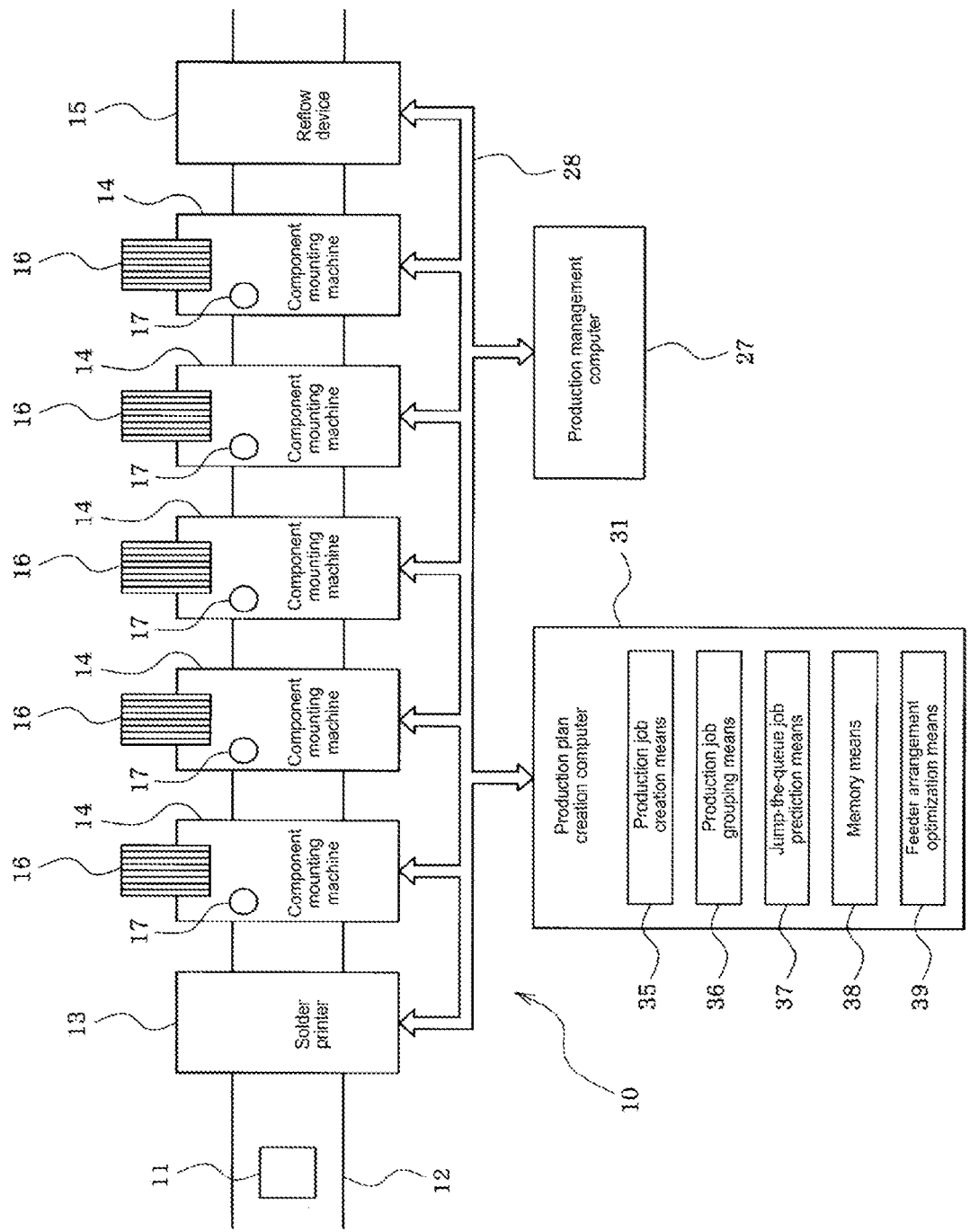
FIG. 1 shows an example configuration of a component mounting line for an embodiment of the present disclosure.

An embodiment of the disclosure is described below. First, the configuration of component mounting line 10 will be described based on FIG. 1.

Multiple component mounting machines 14 that mount components on circuit board 11 and mounting related machines that perform work related to component mounting are lined up along conveyance line 12 along which circuit board 11 is conveyed. Here, a mounting related machine may be, for example, solder printer 13, reflow device 15, an inspection device, an adhesive applying device, or the like.

Multiple feeders 16 that each supply components are exchangeably loaded on a feeder setting table (not shown) of each component mounting machine 14. One or multiple suction nozzles (not shown) that pick up a component from feeders 16 and mount the component on circuit board 11 are exchangeably held on mounting head 17 of each component mounting machine 14.

Figure 2:
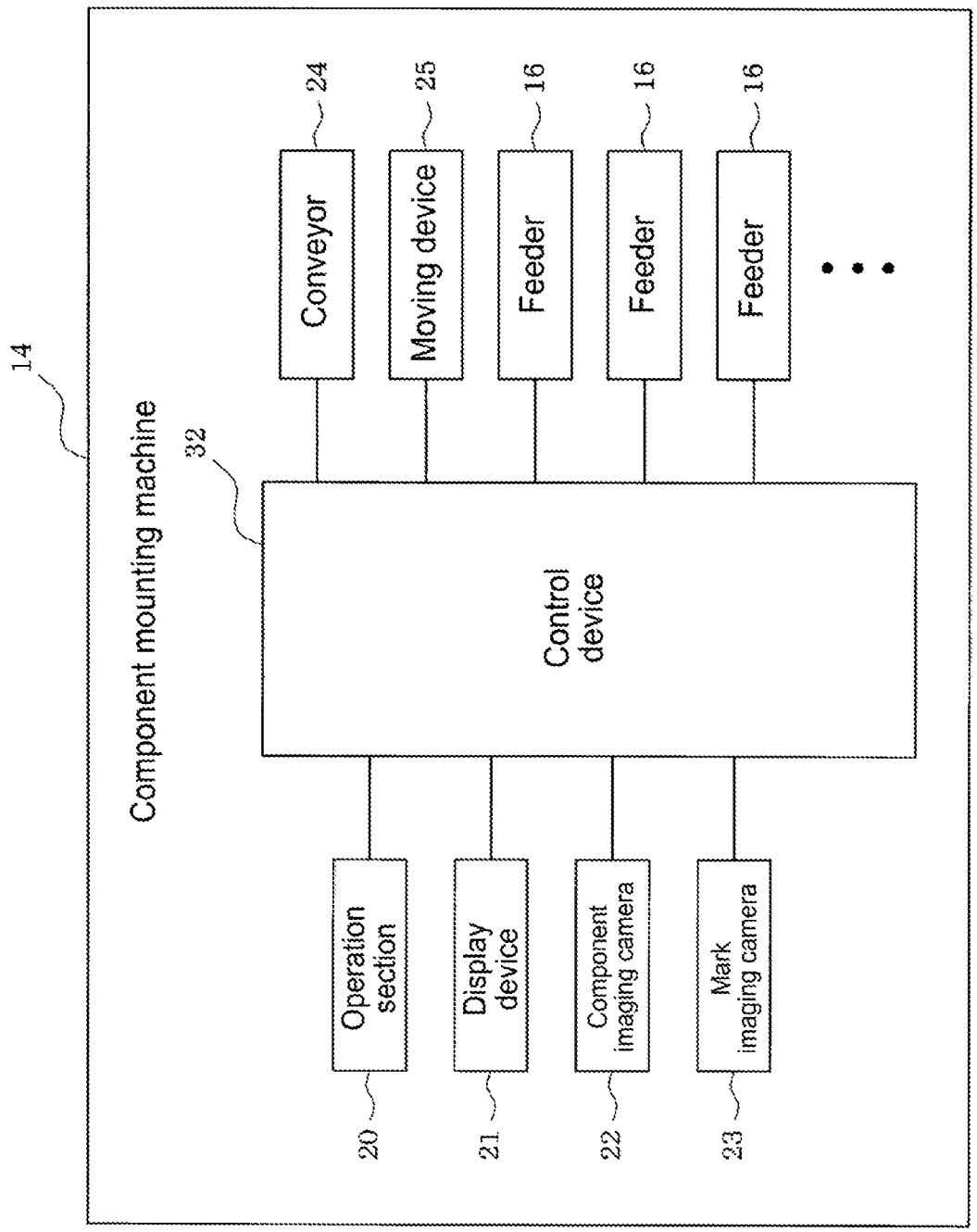
FIG. 2 is a block diagram showing the configuration of control items of a component mounting machine.

As shown in FIG. 2, provided in each component mounting machine 14 are items such as: operation section 20 such as a keyboard, touch panel, and mouse; display device 21 such as an LCD or a CRT; component imaging camera 22 for capturing an image of a component held by a suction nozzle so as to recognize the component pickup orientation, the component pickup deviation, and the like; board imaging camera 23 for capturing an image of reference marks (not shown) of circuit board 11 and the like; conveyor 24 for conveying circuit board 11; and moving device 25 for moving mounting head 17 in XY directions (horizontal directions).

As shown in FIG. 1, multiple component mounting machines 14 and mounting related machines such as solder printer 13 that configure component mounting line 10 are connected so as to production management computer 27 that manages production of component mounting line 10 via network 28 such that communication is possible, and further connected to network 28 is production plan creation computer 31 for creating production jobs (production programs) for performing production operations on each component mounting machine 14, with production jobs created by production plan creation computer 31 and information of setup groups to be described later being sent to the component mounting machines 14 via network 28.

Control device 32 of each component mounting machine 14 operates moving device 25 and the like according to a production job received from production plan creation computer 31, moving mounting head 17 along a path from a component pickup position to a component imaging position to a component mounting position so as to pick up a component supplied from a feeder 16 using a suction nozzle of mounting head 17, imaging the picked up component using component imaging camera 22 to recognize the component pickup position deviation amount and the like, and mounting the component on circuit board, then repeating those operations to produce a circuit board 11 with a specified quantity of components mounted on it.

Production plan creation computer 31, by performing the production plan creation program of FIG. 3 described later during a production plan creation process before starting production, functions as production job creation means 35 that creates or enters multiple production jobs required for producing multiple types of component-mounted boards that are planned to be produced, and functions as production job grouping means 36 that, when grouping the multiple production jobs into multiple setup groups, groups production jobs such that changeover is not required for each of the setup groups, and also functions as jump-the-queue job prediction means 37 that predicts or enters a production job (hereinafter referred to as a "jump-the-queue job") that may need to be performed unscheduled during a period in which one of the multiple production jobs is being performed; wherein production job grouping means 36 performs grouping such that the jump-the-queue job predicted or entered by jump-the-queue prediction means 36 is included in all of the multiple setup groups or in at least two of the multiple setup groups.

Here, the creation method for setup groups of the present embodiment is described using FIGS. 4 and 5. In FIGS. 4 and 5, seven production jobs, numbers 1 to 7, for producing seven types of component-mounted boards are created, and production job number 1 is predicted or entered as a jump-the-queue job from these seven production jobs 1 to 7. The component types to be used in each of the production jobs 1 to 7 are represented by letters A to U. For each production job 1 to 7 there are three component types (feeders 16) to be used that are different to the component types to be used in all the other production jobs 1 to 7. In reality, the component types to be used in each production job 1 to 7 are not limited to three types, and the quantity of component types to be used in each production job 1 to 7 may differ from the quantity used in the other production jobs 1 to 7, also, a portion or all of the component types to be used in each production job 1 to 7 may be the same as the component types to be used in another production job. For example, even if the component types to be used are the same, if the component mounting positions are different, the production job is different.

Further, in the example of FIG. 5, the jump-the-queue job (production job 1) is included in all of the setup groups 1 to 3, but in a case in which due to restrictions on the loading quantity of feeders 16 or the like in a portion of the setup groups it is not possible to load the feeders 16 for the component types used in the jump-the-queue job, the jump-the-queue job does not have to be included in a portion of the setup groups, so long as the jump-the-queue job is included in at least two of the setup groups. Also, the quantity of jump-the-queue jobs included in each setup group is not limited to one, there may be two or more. Setup groups including the jump-the-queue job are created for each of the multiple component mounting machines 14 that configure component mounting line 10.

Also, in the example of FIGS. 4 and 5, a production job that may become a jump-the-queue job was predicted or entered from among the seven production jobs 1 to 7 required to produce the seven types of component-mounted boards planned to be produced, but the jump-the-queue job may be predicted or entered from among jobs other than the seven production jobs 1 to 7 (for example, production jobs performed in the past, production jobs which may be performed in the future, or the like).

Further, prediction of a jump-the-queue job may be performed in any manner, for example, a jump-the-queue job may be predicted or entered by an operator based on experience, production results, order trends, or the like; alternatively, production result data related to previously performed production jobs and jump-the-queue jobs may be memorized on non-volatile memory means 38 for which rewriting is possible (for example, a hard disk device or the like), and jump-the-queue job prediction means 37 may automatically predict the jump-the-queue job based on the production results data memorized on memory means 38.

In this case, the quantity of predicted jump-the-queue jobs is not limited to one, the quantity may be two or greater, but if the quantity of jump-the-queue jobs is large, it will be difficult to include all the jump-the-queue jobs in the multiple setup groups.

Thus, production job grouping means 36, in a case in which the quantity of the jump-the-queue jobs predicted or entered by jump-the-queue job prediction means 37 exceeds a possible grouping quantity of the setup groups, may select the jump-the-queue job to be grouped in the setup group based on at least one of a priority level of each of the jump-the-queue jobs or a jump-the-queue frequency of the jump-the-queue jobs. Thus, if the quantity of predicted or entered jump-the-queue jobs is large, the jump-the-queue jobs grouped in the setup groups can be limited to those with a high priority or those with a high jump-the-queue frequency. Note that, a portion of jump-the-queue jobs grouped in a setup group may be different to another portion of jump-the-queue jobs grouped in a setup group.

In this case, the determination of the priority of the jump-the-queue jobs and the jump-the-queue frequency of the jump-the-queue jobs may be performed automatically by production plan creation computer 31, or at least one of the priority of the jump-the-queue jobs and the jump-the-queue frequency of the jump-the-queue jobs may be set by an operator using a setting means (not shown).

Also, among jump-the-queue jobs, there may be some jobs with a higher priority than normal production jobs and some jobs with a lower priority than normal production jobs. And, among jump-the-queue jobs, some jobs may have a lower jump-the-queue frequency and some jobs may have a higher jump-the-queue frequency. Further, depending on the arrangement (loading order) of feeders 16, the production efficiency of the jump-the-queue jobs or the production jobs may change, thereby changing the production time.

Considering these circumstances, in the present embodiment, production plan creation computer 31 functions as feeder arrangement optimization means 39 configured to optimize an arrangement of the feeders 16 to be loaded on component mounting machine 14, feeder arrangement optimization means 39 being configured to optimize the arrangement of feeders 16 of each of the setup groups based on at least one of the priority level of each of the jump-the-queue jobs or the jump-the-queue frequency of the jump-the-queue jobs predicted or entered by jump-the-queue job prediction means 37. For example, if the priority of the jump-the-queue job is low, optimization of the arrangement of feeders 16 may be performed giving priority to the normal production jobs, but if the priority of the jump-the-queue job is high, optimization of the feeder arrangement may be performed giving priority to jump-the-queue job; further, optimization of the arrangement of feeders 16 may be performed after determining the priority from the jump-the-queue frequency of the jump-the-queue job.

Figure 6:
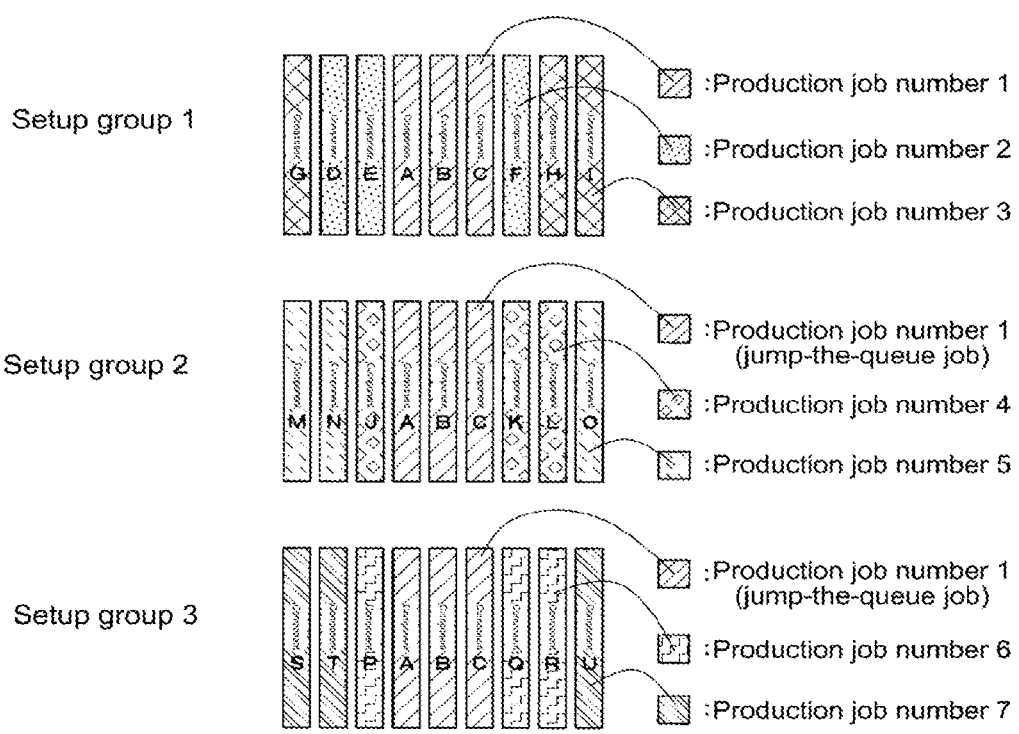
FIG. 6 illustrates an example of optimization of a feeder arrangement in a case in which the priority of the jump-the-queue job is high.
Figure 7:
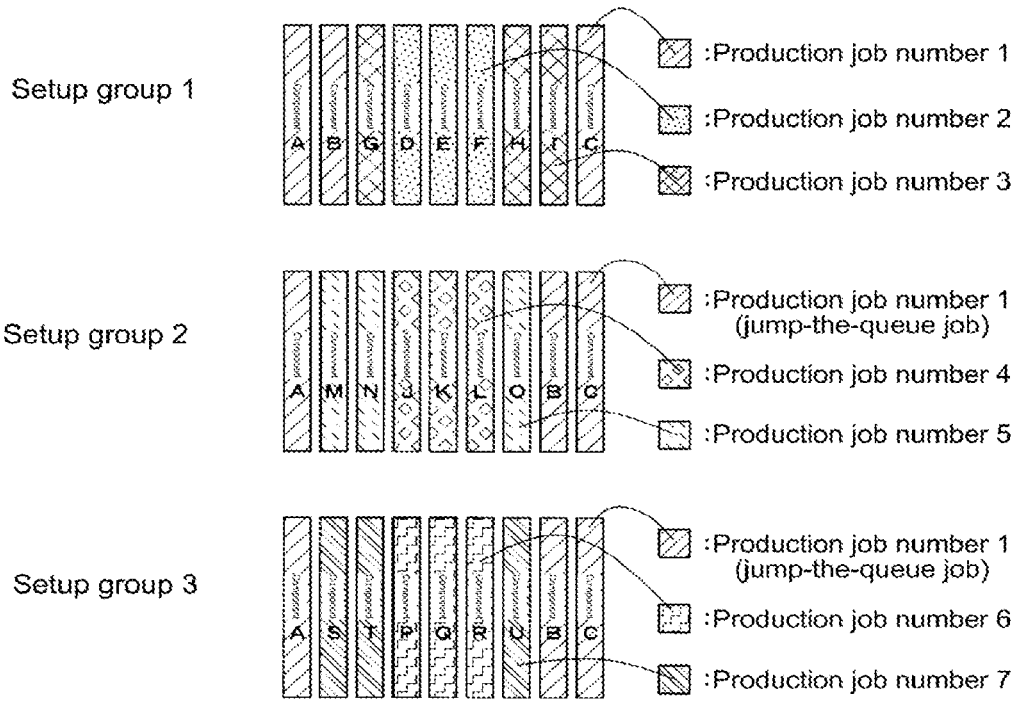
FIG. 7 illustrates an example of optimization of a feeder arrangement in a case in which the priority of the jump-the-queue job is low.

Next, the optimization method for the arrangement of feeders 16 of the present embodiment is described using FIGS. 6 and 7. FIGS. 6 and 7 illustrate an example of optimization of the arrangement of feeders 16 for three setup groups from FIG. 3, setup groups 1 to 3, in a case in which the priority level of each of the production jobs 1 to 7 is that set as shown in FIG. 4; FIG. 6 illustrates an example of optimization of the arrangement of feeders 16 when the priority of the jump-the-queue job (production job 1) is high; FIG. 7 illustrates an example of optimization of the arrangement of feeders 16 when the priority of the jump-the-queue job (production job 1) is low.

In the examples of FIGS. 6 and 7, the arrangement of feeders 16 is optimized based on that the closer to the center of the feeder setting table of component mounting machine 14, the higher the production efficiency.

In the example shown in FIG. 6, because the priority of the jump-the-queue job (production job 1) is higher than the priority of production jobs 2 to 7, in each setup group 1 to 3, feeders 16 for the component types A, B, and C that are used in the jump-the-queue job (production job 1) are arranged at the central section of the feeder setting table. Among production jobs 1 to 3 of setup group 1, because production job 2 has the second highest priority of "medium", the feeders 16 for the component types D, E, and F that are used in production job 2 are arranged on both sides of the arrangement area of the feeders 16 of the jump-the-queue job (production job 1) for which the priority is the highest; further, the feeders 16 for the component types G, H, and I used in production job 3 for which the priority is lowest are arranged at the empty spaces at both ends of the feeder setting table. In contrast, among production jobs 1, 4, and 5 of setup group 2, because production job 4 has the second highest priority of "medium", the feeders 16 for the component types J, K, and L that are used in production job 4 are arranged on both sides of the arrangement area of the feeders 16 of the jump-the-queue job (production job 1) for which the priority is the highest; further, the feeders 16 for the component types M, N, and O used in production job 5 for which the priority is lowest are arranged at the empty spaces at both ends of the feeder setting table. In further contrast, among production jobs 1, 6, and 7 of setup group 3, because production job 6 has the second highest priority of "medium", the feeders 16 for the component types P, Q and R that are used in production job 6 are arranged on both sides of the arrangement area of the feeders 16 of the jump-the-queue job (production job 1) for which the priority is the highest; further, the feeders 16 for the component types S, T, and U used in production job 6 for which the priority is lowest are arranged at the empty spaces at both ends of the feeder setting table.

In the example shown in FIG. 7, because the priority of the jump-the-queue job (production job 1) is lower than the priority of production jobs 2 to 7, in each setup group 1 to 3, feeders 16 for the component types A, B, and C that are used in the jump-the-queue job (production job 1) are arranged at the ends of the feeder setting table. Among production jobs 1 to 3 of setup group 1, because production job 2 has the highest priority, feeders 16 for components D, E, and F that are used in production job 2 are arranged at the central section of the feeder setting table. In contrast, among production jobs 1 to 3 of setup group 1, because production job 3 has the second highest priority of "medium", the feeders 16 for the component types G, H, and I that are used in production job 3 are arranged on both sides of the arrangement area of the feeders 16 of the jump-the-queue job (production job 1) for which the priority is the highest. In further contrast, among production jobs 1, 4, and 5 of setup group 2, because production job 4 has the highest priority, feeders 16 for components J, K, and L that are used in production job 4 are arranged at the central section of the feeder setting table. Further, because production job 5 has the second highest priority of "medium", the feeders 16 for the component types M, N, and O that are used in production job 5 are arranged on both sides of the arrangement area of the feeders 16 of production job 5 for which the priority is the highest. In further contrast, among production jobs 1, 6, and 7 of setup group 3, because production job 6 has the highest priority, feeders 16 for components P, Q and R that are used in production job 6 are arranged at the central section of the feeder setting table. Further, because production job 7 has the second highest priority of "medium", the feeders 16 for the component types S, T, and U that are used in production job 7 are arranged on both sides of the arrangement area of the feeders 16 of production job 5 for which the priority is the highest.

Figure 3:
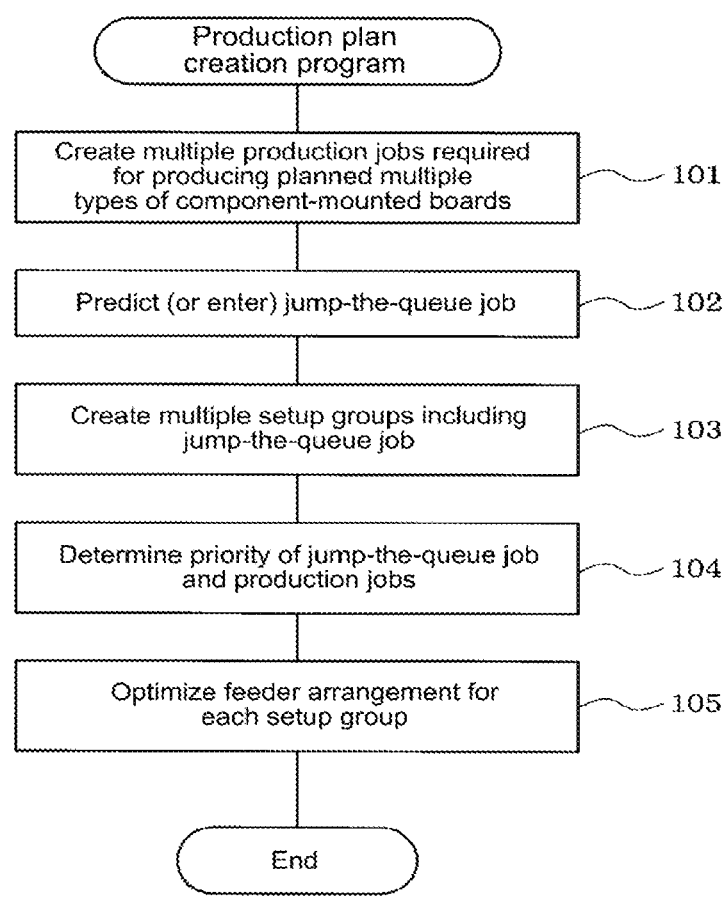
FIG. 3 is a flowchart showing processing of a production plan creation program.

Creation of a production plan in an embodiment described above is performed during a production plan creation process before production starts by production plan creation computer 31 in accordance with the production plan creation program of FIG. 3. When the production plan creation program of FIG. 3 is started, first, in step 101, multiple production jobs required for producing the multiple types of component-mounted boards planned to be produced in the current plan are created (or entered), then, in step 102, a jump-the-queue job is predicted (or entered). Next, progressing to step 103, the jump-the-queue job and the production jobs are grouped into multiple setup groups, with the jump-the-queue job being included in all the setup groups.

Next, progressing to step 104, the priorities of the jump-the-queue job and the production jobs are determined, then, in step 105, for each setup group, the arrangement of feeders 16 is optimized based on the priorities of the jump-the-queue job and the production jobs, then the program ends.

With an embodiment described above, when creating a production plan, a jump-the-queue job is predicted or entered, and that jump-the-job is included in all of or at least two of the multiple setup groups, thus, even if the jump-the-queue job actually needs to be performed unscheduled during a period while one of the production jobs of a setup group is being performed, so long as the setup group includes the jump-the-queue job, the jump-the-queue production job can be performed without performing change-over, thereby improving productivity.

Note that, the present disclosure is not limited to the embodiments described above and it goes without saying that various embodiments with changes that do not extend beyond the scope of the disclosure are possible, such as that suitable changes may be made to the configuration of component mounting line 10.

REFERENCE SIGNS LIST

10: component mounting line;
11: circuit board;
12: conveyance path;
14: component mounting machine;
16: feeder;
17: mounting head;
27: production management computer;
31: production plan creation computer;
35: production job creation means;
36: production job grouping means;
37: jump-the-queue job prediction means;
38: memory means;
39: feeder arrangement optimization means

The invention claimed is:

1. A production plan creation system for creating a production plan for producing a component-mounted board by exchangeably loading multiple feeders on a component mounting machine, picking up components supplied by the feeders using suction nozzles of the component mounting machine, and mounting the components on a circuit board, the production plan creation system comprising:

production job grouping means for, when grouping multiple production jobs required to produce multiple types of component-mounted boards that are planned into multiple setup groups, grouping the multiple production jobs such that changeover is not required for each of the multiple setup groups; and jump-the-queue job prediction means for predicting or entering a jump-the-queue job having a possibility of needing to be performed unscheduled during a period in which one of the multiple production jobs is being performed, wherein the production job grouping means performs the grouping such that the same jump-the-queue job predicted or entered by the jump-the-queue prediction means is included in all of the multiple setup groups or in at least two of the multiple setup groups.

2. The production plan creation system according to claim 1, wherein the jump-the-queue job prediction means predicts or enters a production job as the jump-the-queue job from the multiple production jobs required to produce the multiple types of component-mounted boards that are planned.

3. The production plan creation system according to claim 1, further including memory means for memorizing production result data related to previously performed production jobs and jump-the-queue jobs, wherein the jump-the-queue job prediction means predicts the jump-the-queue job based on the memorized production result data.

4. The production plan creation system according to claim 1, wherein the production job grouping means, in a case in which a quantity of jump-the-queue jobs predicted or entered by the jump-the-queue job prediction means exceeds a possible grouping quantity of the multiple setup groups, selects the jump-the-queue job to be grouped in a setup group based on at least one of a priority level of each of the jump-the-queue jobs or a jump-the-queue frequency of the jump-the-queue jobs.

5. The production plan creation system according to claim 4, further including feeder arrangement optimization means for optimizing an arrangement of the feeders to be loaded on the component mounting machine, including optimizing the feeder arrangement of each of the multiple setup groups based on at least one of the priority level of each of the jump-the-queue jobs or the jump-the-queue frequency of the jump-the-queue jobs predicted or entered by the jump-the-queue job prediction means.

6. The production plan creation system according to claim 4, further including setting means for allowing an operator to enter at least one of the priority level of each of the jump-the-queue jobs or the jump-the-queue frequency of the jump-the-queue jobs.

7. A production plan creation method for creating a production plan for producing a component-mounted board by exchangeably loading multiple feeders on a component mounting machine, picking up components supplied by the feeders using suction nozzles of the component mounting machine, and mounting the components on a circuit board, the production plan creation method comprising:

when grouping multiple production jobs required to produce multiple types of component-mounted boards that are planned into multiple setup groups, grouping the multiple production jobs such that changeover is not required for each of the multiple setup groups; and predicting or entering a jump-the-queue job having a possibility of needing to be performed unscheduled during a period in which one of the multiple production jobs is being performed, wherein the grouping is performed such that the same jump-the-queue job predicted by the jump-the-queue predicting is included in all of the multiple setup groups or in at least two of the multiple setup groups.

8. The production plan creation method according to claim 7, further including entering or predicting a production job as the jump-the-queue job from the multiple production jobs required to produce the multiple types of component-mounted boards that are planned.

9. The production plan creation method according to claim 7, further including memorizing production result data related to previously performed production jobs and jump-the-queue jobs, and predicting the jump-the-queue job based on the memorized production result data.

10. The production plan creation method according to claim 7, further including, in a case in which a quantity of jump-the-queue jobs predicted or entered exceeds a possible grouping quantity of the multiple setup groups, selecting the jump-the-queue job to be grouped in a setup group based on at least one of a priority level of each of the jump-the-queue jobs or a jump-the-queue frequency of the jump-the-queue jobs.

11. The production plan creation method according to claim 10, further including optimizing an arrangement of the feeders to be loaded on the component mounting machine, including optimizing the feeder arrangement of each of the multiple setup groups based on at least one of the priority level of each of the jump-the-queue jobs or the jump-the-queue frequency of the jump-the-queue jobs.

12. The production plan creation method according to claim 10, further including allowing an operator to enter at least one of the priority level of each of the jump-the-queue jobs or the jump-the-queue frequency of the jump-the-queue jobs.

13. A system comprising:
circuitry configured to:
when grouping multiple production jobs required to produce multiple types of component-mounted boards that are planned into multiple setup groups, group the multiple production jobs such that changeover is not required for each of the multiple setup groups; and
predict or enter a jump-the-queue job having a possibility of needing to be performed unscheduled during a period in which one of the multiple production jobs is being performed, wherein
the circuitry performs the grouping such that the same jump-the-queue job is included in all of the multiple setup groups or in at least two of the multiple setup groups.

14. The system according to claim 13, wherein the circuitry is configured to predict or enter a production job as the jump-the-queue job from the multiple production jobs required to produce the multiple types of component-mounted boards that are planned.

15. The system according to claim 13, wherein the circuitry is configured to
memorize production result data related to previously performed production jobs and jump-the-queue jobs, and
predict the jump-the-queue job based on the memorized production result data.

16. The system according to claim 13 wherein the circuitry is configured to, in a case in which a quantity of jump-the-queue jobs predicted or entered by the jump-the-queue job prediction means exceeds a possible grouping quantity of the multiple setup groups, select the jump-the-queue job to be grouped in a setup group based on at least one of a priority level of each of the jump-the-queue jobs or a jump-the-queue frequency of the jump-the-queue jobs.

17. The system according to claim 16, wherein the circuitry is configured to optimize a feeder arrangement of each of the multiple setup groups based on at least one of the priority level of each of the jump-the-queue jobs or the jump-the-queue frequency of the jump-the-queue jobs.

18. The system according to claim 16, wherein the circuitry is configured to allow an operator to enter at least one of the priority level of each of the jump-the-queue jobs or the jump-the-queue frequency of the jump-the-queue jobs.

* * * * *